United States Patent [19]

Todoroki

[11] Patent Number: 5,509,021
[45] Date of Patent: Apr. 16, 1996

[54] VITERBI DECODER FOR DECODING ERROR-CORRECTING ENCODED INFORMATION SYMBOL STRING

[75] Inventor: Toshiya Todoroki, Tokyo, Japan

[73] Assignee: NEC Corporation, Japan

[21] Appl. No.: 66,552

[22] Filed: May 26, 1993

[30] Foreign Application Priority Data

May 27, 1992 [JP] Japan ..................... 4-160437

[51] Int. Cl.$^6$ .................... G06F 11/10; H03M 13/12; H03M 7/00; H03M 13/00
[52] U.S. Cl. .................... 371/43; 341/78; 341/94
[58] Field of Search .................... 371/43, 44, 45, 371/46; 341/94, 78

[56] References Cited

U.S. PATENT DOCUMENTS 5,220,570  6/1993  Lou et al. .................... 371/43

OTHER PUBLICATIONS

Ungerboech, G., *Channel Coding with Multilevel/Phase Signals*, IEEE, Transactions on Information Theory, vol. IT–28, No. 1, pp. 55–67, Jan. 1982.

Aikawa, S., et al., *Design Schemes for a High-Speed/Multi-Level Trellis Coded Modulation Viterbi Decoder*, Journal of the Electronic Information Communication Society, vol. J73–A, No. 2, pp. 331–340, Feb. 1990.

Aikawa, S., et al., *150 KGate General-Purpose High-Coding-Gain TCM VLSIs for High-Speed Multi-Level QAM Systems*, IEEE GLOBECOM, pp. 1963–1967, 1990.

Primary Examiner—Roy N. Envall, Jr.
Assistant Examiner—Emmanuel L. Moise
Attorney, Agent, or Firm—Ostrolenk, Faber, Gerb & Soffen

[57] ABSTRACT

A Viterbi decoder includes a branch metric generator, a subset maximum likelihood estimator, an accumulator switch circuit (ACS circuit), a most likely path setter, a first selector, and a path-memory circuit for the purpose of estimating encoding bits of a 4-bit error-correcting encoded information symbol string. The Viterbi decoder also includes a noncoding bit detector, eight j-level shift registers, and a second selector for the purpose of estimating a noncoding bit of the 4-bit error-correcting encoded information symbol string. The j-level shift registers are provided for temporarily holding the output signals of the noncoding bit detector. The second selector is provided for selecting one output signal from the output signals of the j-level shift registers in accordance with the output signal of the selector.

4 Claims, 9 Drawing Sheets

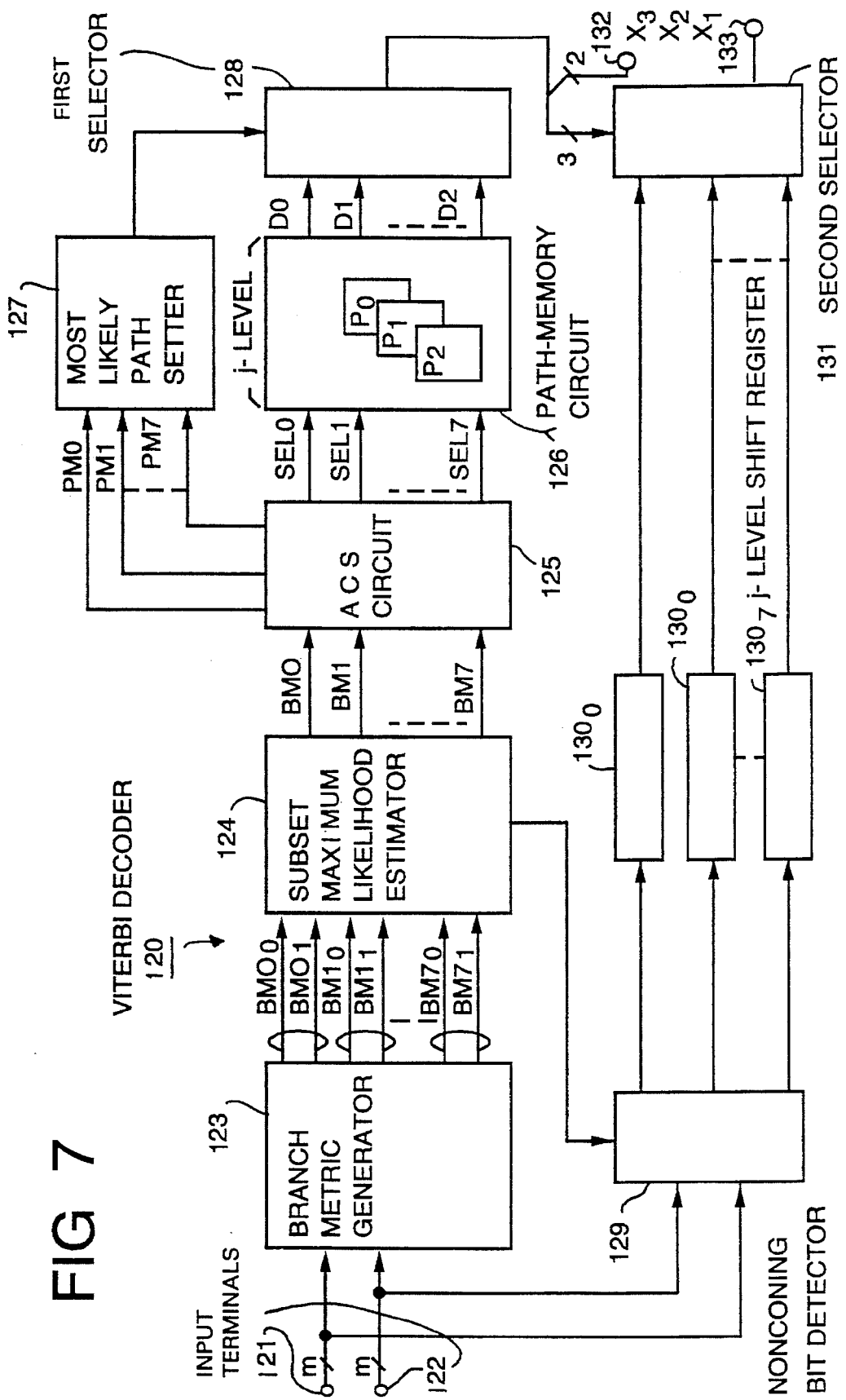

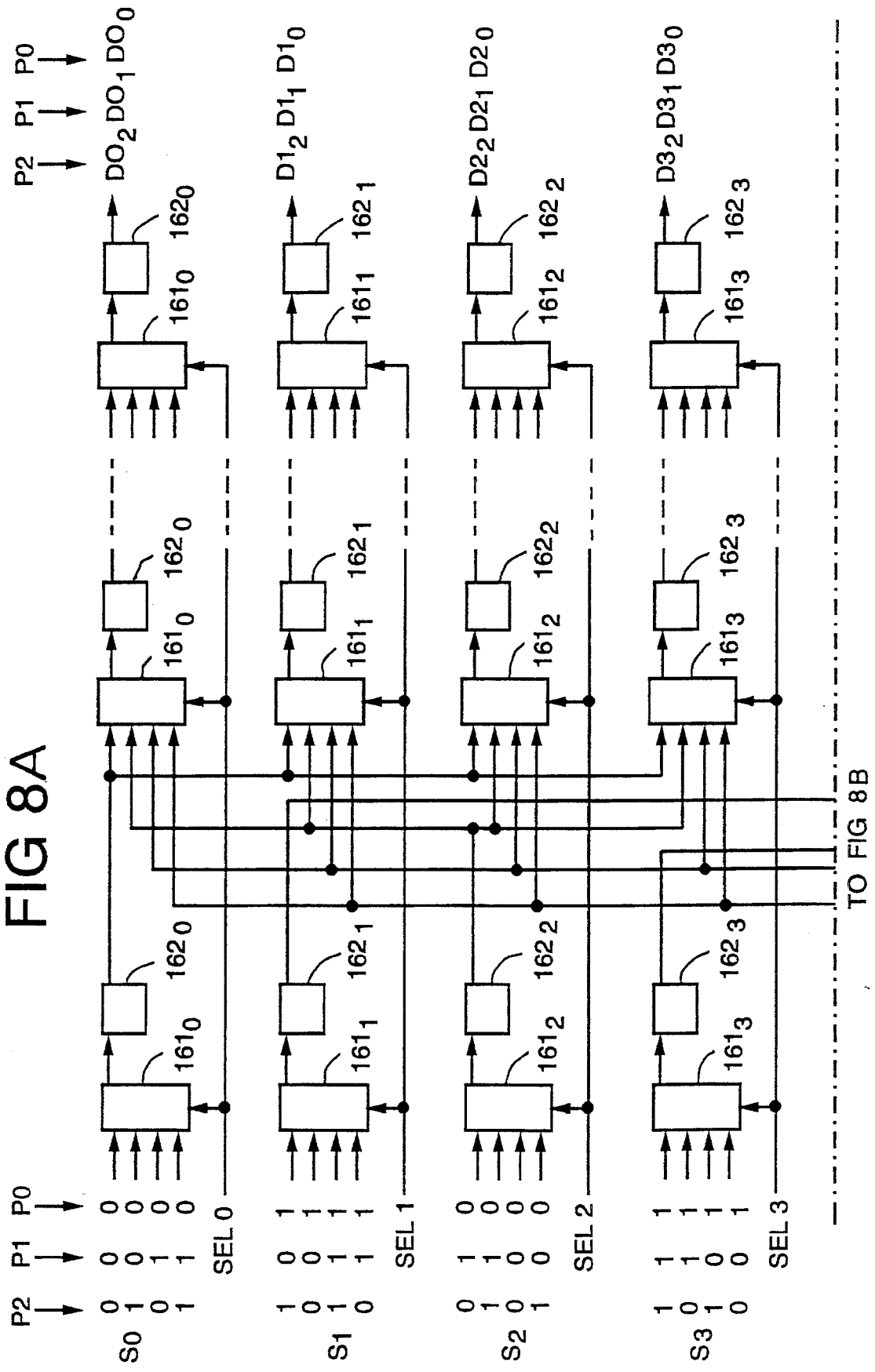

VITERBI DECODER FOR DECODING ERROR-CORRECTING ENCODED INFORMATION SYMBOL STRING

BACKGROUND OF THE INVENTION

The present invention relates to a Viterbi decoder provided in a receiver for decoding an error-correcting encoded information symbol string in a communication system in which an information symbol string is transmitted after being error-correcting encoded by means of a feedback-type convolutional encoder and quadrature amplitude-modulated.

In the digital communication field, error-correcting encoding methods and modulation methods have conventionally been considered as separate and independent subjects. Recently however, an encoded modulation technique that combines error-correcting techniques and modulation/demodulation techniques has been proposed (G. Ungerboeck, Channel Coding with Multilevel/Phase Signals, IEEE Transactions on Information Theory, vol. IT-28, January 1983). This proposed encoded modulation technique is, formally speaking, a technique of quadrature amplitude modulation of an error-correcting encoded information symbol string which is generated by error-correcting encoding an information symbol string by means of a convolutional encoder, but in the process of quadrature amplitude modulation, a measure has been taken for the arrangement of transmission symbol points. According to this measure, in the convolutional encoder, through the addition of 1-bit redundancy based on the state of finite state memories provided in the convolutional encoder, an N-bit information string is converted to an (N+1)-bit error-correcting encoded information symbol string. The error-correcting encoded information symbol string, when quadrature amplitude-modulated, is mapped onto one of $2^{N+1}$ transmission symbol points. The $2^{N+1}$ transmission symbol points are then arranged in a two-dimensional plane based on an I-axis and a Q-axis. The error-correcting encoded information symbol string is mapped onto one of the two-dimensionally distributed $2^{N+1}$ transmission symbol points in accordance with its value. As described in the above-mentioned reference, the $2^{N+1}$ transmission symbol points are divided into subsets each of which is constituted from two transmission symbol points. The Euclidean distance between the two transmission symbol points belonging to each subset is then made greater than the Euclidean distance between two arbitrary transmission symbol points. This manner of distribution of each transmission symbol point can be realized by employing the state transition of the finite state memories provided in the convolutional encoder and selecting subsets belonging to the distributed transmission symbol points in order to make available only a few series in accordance with the state transition. Consequently, in this encoded modulation technique, the process up to prescribing the two-dimensional arrangement of the transmission symbol points can be accomplished as the error-correcting encoding process.

FIG. 1 shows the construction of one example of a feedback-type convolutional encoder 40 which can obtain 4-bit error-correcting encoded information symbol string $(y_3y_2y_1y_0)$ through the addition of one redundant bit $(y_0)$ to 3-bit information symbol string $(x_3x_2x_1)$. The 3-bit information symbol string $(x_3x_2x_1)$ and 4-bit error-correcting encoded information symbol string $(y_3y_2y_1y_0)$ have the relation $x_3 = y_3$, $x_2 = y_2$, and $x_1 = y_1$. Each of two lower-order bits $x_2$, $x_1$ of 3-bit information symbol string $(x_3x_2x_1)$ is an encoding bit having influence on the state transition of the feedback-type convolutional encoder 40. The highest-order bit $x_3$ of the 3-bit information symbol string $(x_3x_2x_1)$ is a noncoding bit having no influence on the state transition of the feedback-type convolutional encoder 40.

The feedback-type convolutional encoder 40 includes a first register $41_1$, a second register $41_2$, a third register $41_3$, a first exclusive OR circuit $42_1$, and a second exclusive OR circuit $42_2$. The first to third registers $41_1$–$41_3$ and the first and second exclusive OR circuits $42_1$, $42_2$ are connected together in a series in the following order: the first register $41_1$, the first exclusive OR circuit $42_1$, the second register $41_2$, the second exclusive OR circuit $42_2$, and the third register $41_3$. The output signal of the third register $41_3$ is fed back to the first register $41_1$. The first exclusive OR circuit $42_1$ is provided for finding the exclusive logical sum of the output signal of the first register $41_1$ and encoding bit $x_1$, that is, the lowest-order bit of 3-bit information symbol string $(x_3x_2x_1)$. The second exclusive OR circuit $42_2$ is provided for finding the exclusive logical sum of the output signal of the second register $41_2$ and encoding bit $x_2$, that is, the second low-order bit of 3-bit information symbol string $(x_3x_2x_1)$. As shown in FIG. 1, the feedback-type convolutional encoder 40 has eight states $S_0$–$S_8$ corresponding to values $i_0$–$i_2$ of the first through third registers $41_1$–$41_3$. In addition, the feedback-type convolutional encoder 40 has an encoding rate of "2/3."

As shown in FIG. 2, 4-bit error-correcting encoded information symbol string $(y_3y_2y_1y_0)$ outputted from the feedback-type convolutional encoder 40 is quadrature amplitude-modulated by being mapped onto one of 16 transmission symbol points a–h, a'–h' distributed two-dimensionally on the I-axis–Q-axis plane in accordance with its value. Here, 4-bit error-correcting encoded information symbol string (0000) is mapped onto transmission symbol point a, and 4-bit error-correcting encoded information symbol string (0001) is mapped onto transmission symbol point b. Four-bit error-correcting encoded information symbol string (0010) is mapped onto transmission symbol point c, and 4-bit error-correcting encoded information symbol string (0011) is mapped onto transmission symbol point d. Four-bit error-correcting encoded information symbol string (0100) is mapped onto transmission symbol point e, and 4-bit error-correcting encoded information symbol string (0101) is mapped onto transmission symbol point f. Four-bit error-correcting encoded information symbol string (0110) is mapped onto transmission symbol point g, and 4-bit error-correcting encoded information symbol string (0111) is mapped onto transmission symbol point h. Four-bit error-correcting encoded information symbol string (1000) is mapped onto transmission symbol point a', and 4-bit error-correcting encoded information symbol string (1001) is mapped onto transmission symbol point b'. Four-bit error-correcting encoded information symbol string (1010) is mapped onto transmission symbol point c', and 4-bit error-correcting encoded information symbol string (1011) is mapped onto transmission symbol point d'. Four-bit error-correcting encoded information symbol string (1100) is mapped onto transmission symbol point e', and 4-bit error-correcting encoded information symbol string (1101) is mapped onto transmission symbol point f'. Four-bit error-correcting encoded information symbol string (1110) is mapped onto transmission symbol point g', and 4-bit error-correcting encoded information symbol string (1111) is mapped onto transmission symbol point h'. In addition, the previously mentioned subsets are, in this case, eight subsets A–H where subset A={a, a'}, subset B={b, b'}, subset C={c, c'}, subset D={d, d'}, subset E={e, e'}, subset F={f, f'}, subset G={g, g'}, and subset H={h, h'}.

As described in the above reference, the decoding of an information symbol string that has been error-correcting encoded as well as quadrature amplitude-modulated as described above can be carried out through the use of the Viterbi algorithm known as the maximum likelihood decoding method. The above-mentioned reference, however, does not touch on the concrete construction of a Viterbi decoder. The inventors investigated the above-described decoding of an error-correcting encoded information symbol string using a Viterbi decoder 20 of typical construction as shown in FIG. 3.

The Viterbi decoder 20 includes a branch metric generator 23, a subset maximum likelihood estimator 24, an accumulator switch circuit (hereinafter referred to as ACS circuit 25), a most likely path setter 27, a noncoding bit detector 29, a selector 28 and a path-memory circuit 86. A transmitted signal sent from a transmitter to a receiver is converted to two demodulated signals by being orthogonal-synchronous-detected in an orthogonal synchronous detector (not shown). The amplitudes of the two demodulated signals are each quantized by a quantization circuit (not shown), and the two demodulated signals are thereby converted to m-bit I-channel data Ich and m-bit Q-channel data Qch. I-channel data Ich and Q-channel data Qch are both 2m-value soft decision data. I-channel data Ich and Q-channel data Qch are inputted to the branch metric generator 23 and the noncoding bit detector 29 by way of two input terminals 21, 22, respectively.

The distances (branch metrics) between a reception symbol point and each transmission symbol point (corresponding to each transmission symbol point a–h, a'–h'shown in FIG. 2) are each found in the branch metric generator 23. For example, if the reception symbol point on a plane made up of an I-axis and a Q-axis for the two demodulated signals obtained by orthogonal-synchronous-detection of the transmitted signal is located at reception symbol point R shown in FIG. 4 because of the addition of noise in the transmission path, branch metrics $BM0_0$–$BM7_0$ and $BM0_1$–$BM7_1$ are each found for reception symbol point R in the branch metric generator 23 as shown below:

Branch metric $BM0_0$=the distance from reception symbol point R to transmission symbol point a
Branch metric $BM0_1$=the distance from reception symbol point R to transmission symbol point a'
Branch metric $BM1_0$=the distance from reception symbol point R to transmission symbol point b
Branch metric $BM1_1$=the distance from reception symbol point R to transmission symbol point b'
Branch metric $BM2_0$=the distance from reception symbol point R to transmission symbol point c
Branch metric $BM2_1$=the distance from reception symbol point R to transmission symbol point c' Branch metric $BM3_0$=the distance from reception symbol point R to transmission symbol point d
Branch metric $BM3_1$=the distance from reception symbol point R to transmission symbol point d'
Branch metric $BM4_0$=the distance from reception symbol point R to transmission symbol point e
Branch metric $BM4_1$=the distance from reception symbol point R to transmission symbol point e'
Branch metric $BM5_0$=the distance from reception symbol point R to transmission symbol point f
Branch metric $BM5_1$=the distance from reception symbol point R to transmission symbol point f'
Branch metric $BM6_0$=the distance from reception symbol point R to transmission symbol point g
Branch metric $BM6_1$=the distance from reception symbol point R to transmission symbol point g'
Branch metric $BM7_0$=the distance from reception symbol point R to transmission symbol point h
Branch metric $BM7_1$=the distance from reception symbol point R to transmission symbol point h'

The branch metrics are proportional to Euclidean distances and have proportionally smaller values as the Euclidean distances increase.

In the subset maximum likelihood estimator 24, branch metrics $BM0_0$–$BM7_0$, $BM0_1$–$BM7_1$ sent thereto from the branch metric generator 23 are divided between eight subsets A'–H', where subset A'={$BM0_0$, $BM0_1$}, subset B'={$BM1_0$, $BM1_1$ 56, subset C'={$BM2_0$, $BM2_1$}, subset D'={$BM3_0$, $BM3_1$}, subset E' ={$BM4_0$, $BM4_1$}, subset F'={$BM5_0$, $BM5_1$}, subset G'={$BM6_0$, $BM6_1$}, and subset H'={$BM7_0$, $BM7_1$}, following which branch metric representative values BM0–BM7 in each subset are determined by selecting the branch metric with the larger value in each subset A'–H'. Branch metric representative values BM0–BM7 for each selected branch metric are outputted from the subset maximum likelihood estimator 24 to the ACS circuit 25. In addition, information indicating which branch metric was selected in each subset A'–H'is outputted from the subset maximum likelihood estimator 24 to the noncoding bit detector 29.

In the noncoding bit detector 29, based on the information sent thereto from the subset maximum likelihood estimator 24 and using I-channel data Ich and Q-channel data Qch, the noncoding bits of the transmission symbol points relating to branch metric representative values BM0–BM7 are extracted. At this point, the noncoding bit of 4-bit error-correcting encoded information symbol string $(y_3y_2y_1y_0)$ is $y_3$, but each of the noncoding bits extracted in the noncoding bit detector 29 is represented by $\hat{y}_3^i$. In other words, extracted noncoding bit $\hat{y}_3^i$ represents the representative value of the noncoding bit of subset i when subset i={A, B, C, D, E, F, G, H}.

fin the ACS circuit 25, in accordance with each branch metric representative value BM0–BM7 sent thereto from the subset maximum likelihood estimator 24 and all of the state transitions prescribed by the feedback-type convolutional encoder 40 shown in FIG. 1, each of the path metric accumulated values which are held by the several states combined in transition with one of eight states $S_0$–$S_7$ is added to the predetermined representative value of branch metric representative values BM0–BM7, and the greatest addition value becomes the new path metric accumulated value for the one state. In this way, new path metric accumulated values PM0–PM7 for states $S_0$–$S_7$ are obtained. In addition, from the information of the path selected for every state $S_0$–$S_7$ at this time, eight selector signals $SEL_0$–$SEL_7$, each of which corresponding to a respective state $S_0$–$S_7$, are formed. As shown in FIG. 5, the actual components of the circuit in the ACS circuit 25 for finding path metric accumulated value PM0 and select signal $SEL_0$ for state $S_0$ include first to fourth path metric holding circuits $51_1$–$51_4$, first to fourth adders $52_1$–$52_4$, a comparator 53, and a selector 54. Path metric accumulated value PM0 for state $S_0$ is held in the first path metric holding circuit $51_1$. Path metric accumulated value PM2 for state $S_2$ is held in the second path metric holding circuit $51_2$. Path metric accumulated value PM4 for state $S_4$is held in the third path metric holding circuit $51_3$. Path metric accumulated value PM6 for state $S_6$ is held in the fourth path metric holding circuit $51_4$. In the first adder $52_1$, branch metric representative value BM0 sent thereto from the subset maximum likelihood estimator 24 is added to path metric accumulated value PM0 sent thereto from the first path metric holding circuit $51_1$. In the second adder $52_2$, branch metric representative value BM4 sent thereto from the subset maximum likelihood estimator 24 is added to path metric accumulated value PM2 sent thereto from the second path metric holding circuit $51_2$. In the third adder $52_3$, branch metric representative value BM2 sent thereto from the subset maximum likelihood estimator 24 is added to the path metric accumulated value PM4 sent thereto from the third path metric holding circuit $51_3$. In the fourth adder $52_4$, the branch metric representative value BM6 sent thereto from the subset maximum likelihood estimator 24 is added to the path metric accumulated value PM6 sent thereto from the fourth path metric holding circuit $51_4$. In the comparator 53, the output signals of the first to fourth adders $52_1$–$52_4$ are compared and select signal $SEL_0$ is generated indicating the adder corresponding to the greatest output signal. In the selector 54, one of the output signals of the first to fourth adders $52_1$–$52_4$ is selected in accordance with select signal $SEL_0$ sent thereto from the comparator 53 and then sent to the first path metric holding circuit $51_1$ and held in the first path metric holding circuit $51_1$.

Path metric accumulated values PM1–PM7 and select signals $SEL_1$–$SEL_7$ for other states $S_1$–$S_7$ are at the same time found in the same manner as path metric accumulated value PM0 and select signal $SEL_0$ for state $S_0$. The combinations of the path metric accumulated value and the branch metric representative value inputted to each of the adders corresponding to the first to fourth adders $52_1$–$52_4$ shown in FIG. 5 are shown in Table 1.

TABLE 1

| STATE | COMBINATION | | | |
|---|---|---|---|---|
| | FIRST ADDER | SECOND ADDER | THIRD ADDER | FOURTH ADDER |
| $S_1$ | PM0 and BM4 | PM2 and BM0 | PM4 and BM6 | PM6 and BM2 |
| $S_2$ | PM0 and BM2 | PM2 and BM6 | PM4 and BM0 | PM6 and BM4 |
| $S_3$ | PM0 and BM6 | PM2 and BM2 | PM4 and BM4 | PM6 and BM0 |
| $S_4$ | PM1 and BM1 | PM3 and BM5 | PM5 and BM3 | PM7 and BM7 |
| $S_5$ | PM1 and BM5 | PM3 and BM1 | PM5 and BM7 | PM7 and BM3 |
| $S_6$ | PM1 and BM3 | PM3 and BM7 | PM5 and BM1 | PM7 and BM5 |
| $S_7$ | PM1 and BM7 | PM3 and BM3 | PM5 and BM5 | PM7 and BM1 |

Each select signal $SEL_0$–$SEL_7$ is outputted from the ACS circuit 25 to the path-memory circuit 86.

As shown in FIG. 3, the path-memory circuit 86 includes a first memory P1 for finding an estimated value (represented as $\hat{y}_1$) of second lower-order encoding bit $y_1$ of 4-bit error-correcting encoded information symbol string $(y_3y_2y_1y_0)$, a second memory P2 for finding an estimated value (represented as $\hat{y}_2$) of second higher-order encoding bit $y_2$, and a third memory P3 for finding an estimated value (represented as $\hat{y}_3$) of highest-order encoding bit $y_3$. In addition, each of the first to third memories P1–P3 has the same construction, in concrete terms, as the j-level construction shown in FIG. 6. Here, each level is made up of eight selectors $91_0$–$91_7$ for selecting one of the four input signals in accordance with selector signals $SEL_0$–$SEL_7$ sent thereto from the ACS circuit 25 and eight registers $92_0$–$92_7$ for storing the output signals of the selectors $91_0$–$91_7$. As shown in FIG. 6, the input signal of each selector $91_0$–$91_7$ on the first level is, in the first memory P1, an initial value (0011) for selector $91_0$ of state $S_0$, selector $91_1$ of state $S_1$, selector $91_4$ of state $S_4$, and selector $91_5$ of state $S_5$ and an initial value (1100) for the remaining selectors $91_2$, $91_3$, $91_6$, and $91_7$. In the second memory P2, it is an initial value (0101) for selector $91_0$ of state $S_0$, selector $91_2$ of state $S_2$, selector $91_4$ of state $S_4$, and selector $91_6$ of state $S_6$ and an initial value (1010) for the remaining selectors $91_1$, $91_3$, $91_5$, and $91_7$. In the third memory P3, the signal inputted to each of the selectors $91_0$–$91_7$ of states $S_0$–$S_7$ is the respective noncoding bit of noncoding bits $y_3^A$–$y_3^H$ sent thereto from the noncoding bit detector 29. The input signals for each selector $91_0$–$91_7$ on the second to j-th levels are, for selectors $91_0$–$91_3$, the output signals of registers $92_0$, $92_2$, $92_4$, and $92_6$ on the preceding level, and for selectors $91_4$–$91_7$, the output signals of registers $92_1$, $92_3$, $92_5$, and $92_7$ on the preceding level. The output signal of each register $92_0$–$92_7$ on the j th level is, in the first memory P1, each respective state $D0_1$–$D7_1$, in the second memory P2, each respective state $D0_2$–$D7_2$, and in the third memory P3, each respective state $D0_3$–$D7_3$. The operation of each selector $91_0$–$91_7$ and each register $92_0$–$92_7$ on each level is performed both simultaneously and in parallel within the time (hereinafter referred to as "symbol time") during which one 4-bit error-correcting encoded information symbol string $(y_3y_2y_1y_0)$ is sent.

In the most likely path setter 27, the sizes of path metric accumulated values $PM_0$–$PM_7$ for states $S_0$–$S_7$ sent thereto from the ACS circuit 25 are compared for every symbol time, and the greatest value is outputted from the most likely path setter 27 to selector 28. In selector 28, based on the output signal of the most likely path setter 27, one combination is chosen among states $D0_1$–$D7_1$, $D0_2$–$D7_2$, $D0_3$–$D7_3$ (hereinafter referred to as "D0–D7") for each memory P1–P3 sent thereto from the path-memory circuit 86. In other words, in a case where the output signal of the most likely path setter 27 indicates path metric accumulated value PM0 of state $S_0$, state $D0_1$ of the first memory P1, state $D0_2$ of the second memory P2, and state $D0_3$ of the third memory P3 are selected. The values of the states selected in selector 28 are estimated values $(\hat{y}_3\hat{y}_2\hat{y}_1)$ of the three higher-order bits $(y_3y_2y_1)$ of 4-bit error-correcting encoded information symbol string $(y_4y_3y_2y_1)$ and are taken as desired decoded data $(\hat{x}_3\hat{x}_2\hat{x}_1)$.

The above operation is repeated every time I-channel data Ich and Q-channel data Qch are inputted to the input terminals 21, 22 respectively, and decoded data $(\hat{x}_3\hat{x}_2\hat{x}_1)$ is obtained after j symbol times after the inputting of I-channel data Ich and Q-channel data Qch to the input terminals 21, 22.

However, because the Viterbi decoder 20 of typical construction shown in FIG. 3 is of a construction for estimating the noncoding bit in the path-memory circuit 86, the following problem is encountered. When using only the feedback-type convolutional encoder 40 shown in FIG. 1, in cases where the number of bits of information symbol strings is increased for transmitting a large volume of information, the number of noncoding bits increases to the same extent as the increased bits, and as a result, it is necessary to increase to an equal extent the number of memories provided in the path-memory circuit 86. In other words, the scale of the circuits of the path-memory circuit 86 increases in accordance with the number of noncoding bits, thereby..raising problems regarding the cost and potential for large-scale integrated circuit (LSI).

SUMMARY OF THE INVENTION

An object of the present invention is to provide a Viterbi decoder capable of preventing the increase in the scale of path-memory circuits despite an increase in the number of bits of an information symbol string.

Other objects of the present invention will become obvious from the following description.

In accordance with an aspect of the present invention, there is provided a Viterbi decoder for decoding an error-correcting encoded information symbol string by estimating encoding bits, redundant bits and noncoding bits included in an error-correcting encoded information symbol string which is generated by error-correcting encoding an information symbol string by means of a feedback-type convolutional encoding method, comprising: estimating means for estimating the encoding bits and the redundant bits of the error-correcting encoded information symbol string from two demodulated signals obtained by orthogonal detection of a modulated signal which is generated by quadrature amplitude modulation of the error-correcting encoded information symbol string; and noncoding bit estimating means for estimating the noncoding bits of the error-correcting encoded information symbol string by using the two demodulated signals, the estimated encoding bits, and the estimated redundant bits.

BRIEF DESCRIPTION OF THE DRAWINGS

The features and advantages of the present invention will become apparent from the following description when taken in conjunction with the accompanying drawings in which:

FIG. 7 is a block diagram showing the construction of a Viterbi decoder according to a first embodiment of the present invention;

DESCRIPTION OF THE PREFERRED EMBODIMENTS

Figure 3:
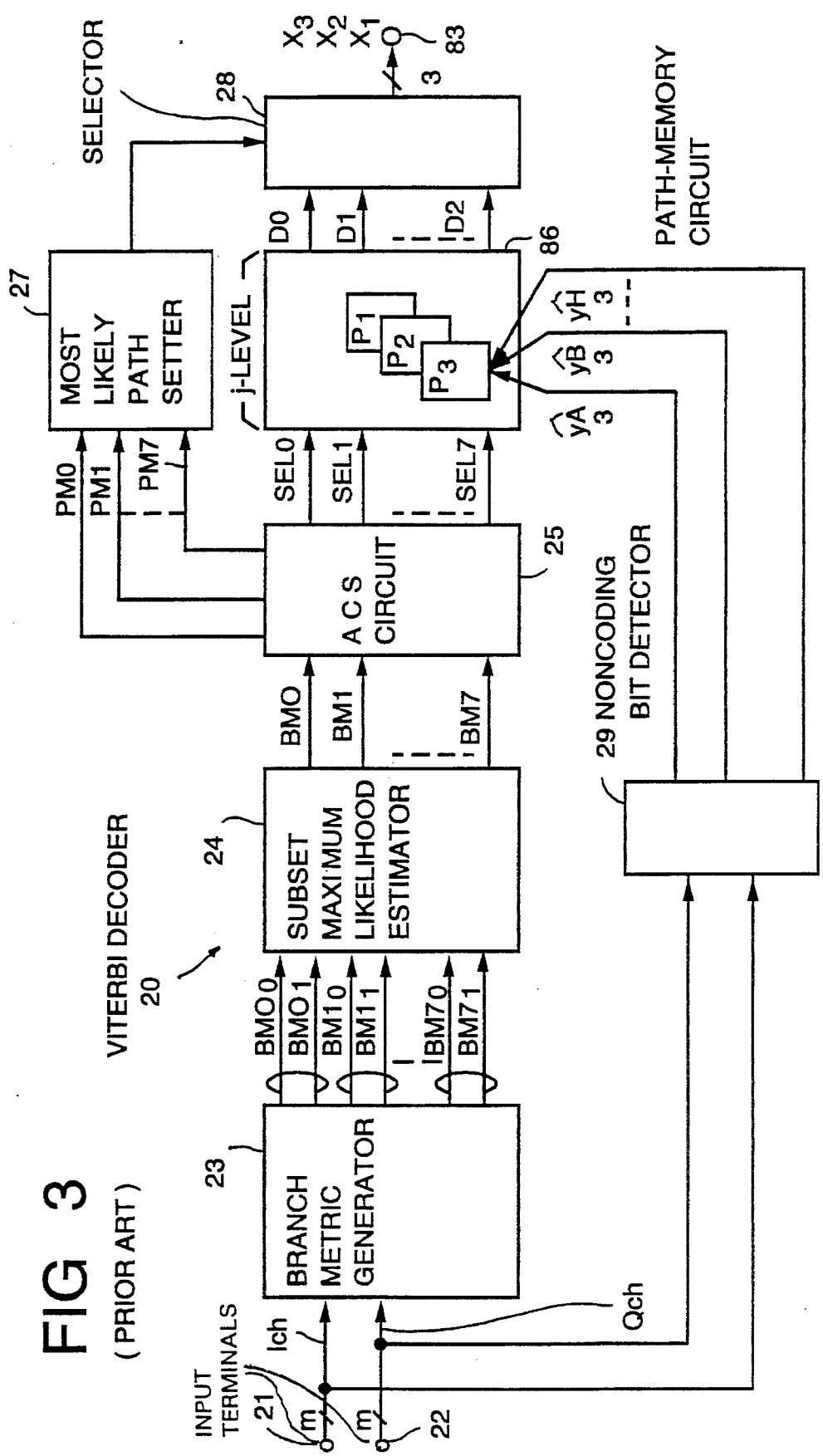
FIG. 3 is a block diagram showing one example of the construction of a Viterbi decoder of typical construction.

As shown in FIG. 7, a Viterbi decoder 120 according to a first embodiment of the present invention includes a branch metric generator 123, a subset maximum likelihood estimator 124, an ACS circuit 125, a most likely path setter 127, a noncoding bit detector 129, a first selector 128, a path-memory circuit 126, eight j-level shift registers $130_0$–$130_7$, and a second selector 131. The branch metric generator 123, the subset maximum likelihood estimator 124, the ACS circuit 125, the most likely path setter 127, the noncoding bit detector 129, and the first selector 128 all have the same construction and operate in the same manner as the branch metric generator 23, the subset maximum likelihood estimator 24, the ACS circuit 25, the most likely path setter 27, the noncoding bit detector 29, and the selector 28 shown in FIG. 3, and consequently, detailed explanation will be presented below for only the path-memory circuit 126, each j-level shift register $130_0$–$130_7$, and the second selector 131.

Figure 4:
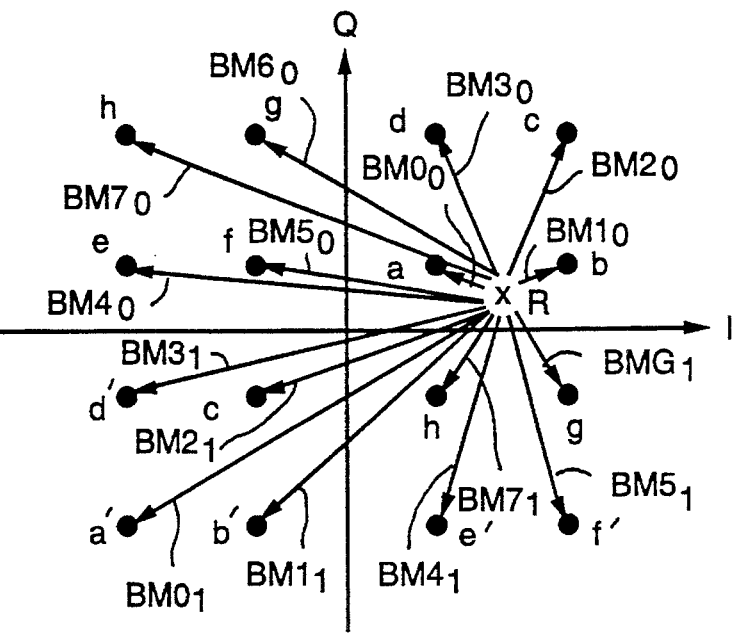
FIG. 4 illustrates the operation of a branch metric generator shown in FIG. 3.
Figure 5:
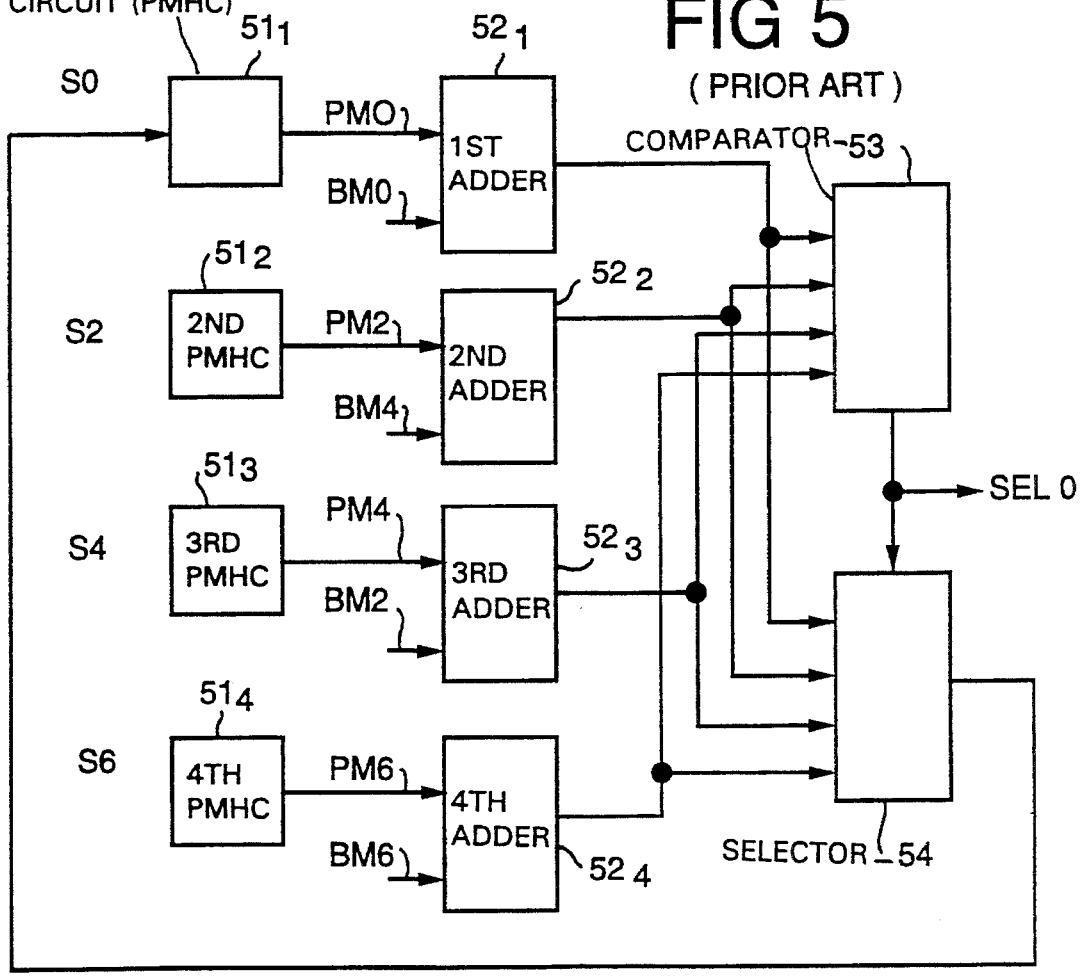
FIG. 5 is a block diagram showing the construction of a circuit for finding path metric accumulated value PM0 and select signal $SEL_0$ in an ACS circuit shown in FIG. 3.

The eight j-level shift registers $130_0$–$130_7$ are for temporarily holding the output signals of the noncoding bit detector 129. For example, the following value is held in the j-level shift register $130_0$: In a case in which branch metric BM00 is selected as the result of comparison of the sizes of branch metric $BM0_0$ and branch metric $BM0_1$ at the subset maximum likelihood estimator 124, the value is the highest-order bit "0" within 4-bit error-correcting encoded information symbol string (0000) mapped onto transmission symbol point a shown in FIG. 4. The second selector 131 is for selecting one output signal from the output signals of the j-level shift registers $130_0$–$130_7$ in accordance with the output signal of the first selector 128. The path-memory circuit 126 differs from the path-memory circuit 86 shown in FIG. 3 on the following three points:

(1) In the place of the third memory P3 provided for finding the estimated value (represented as $\hat{y}_3$) of noncoding bit $y_3$, the highest-order bit of 4-bit error-correcting encoded information symbol string ($y_3y_2y_1y_0$), it includes a memory P0 for finding the estimated value (represented as $\hat{y}_0$) of redundant bit $y_0$, the lowest-order bit of 4-bit error-correcting encoded information symbol string ($y_3y_2y_1y_0$).

Figure 6A:
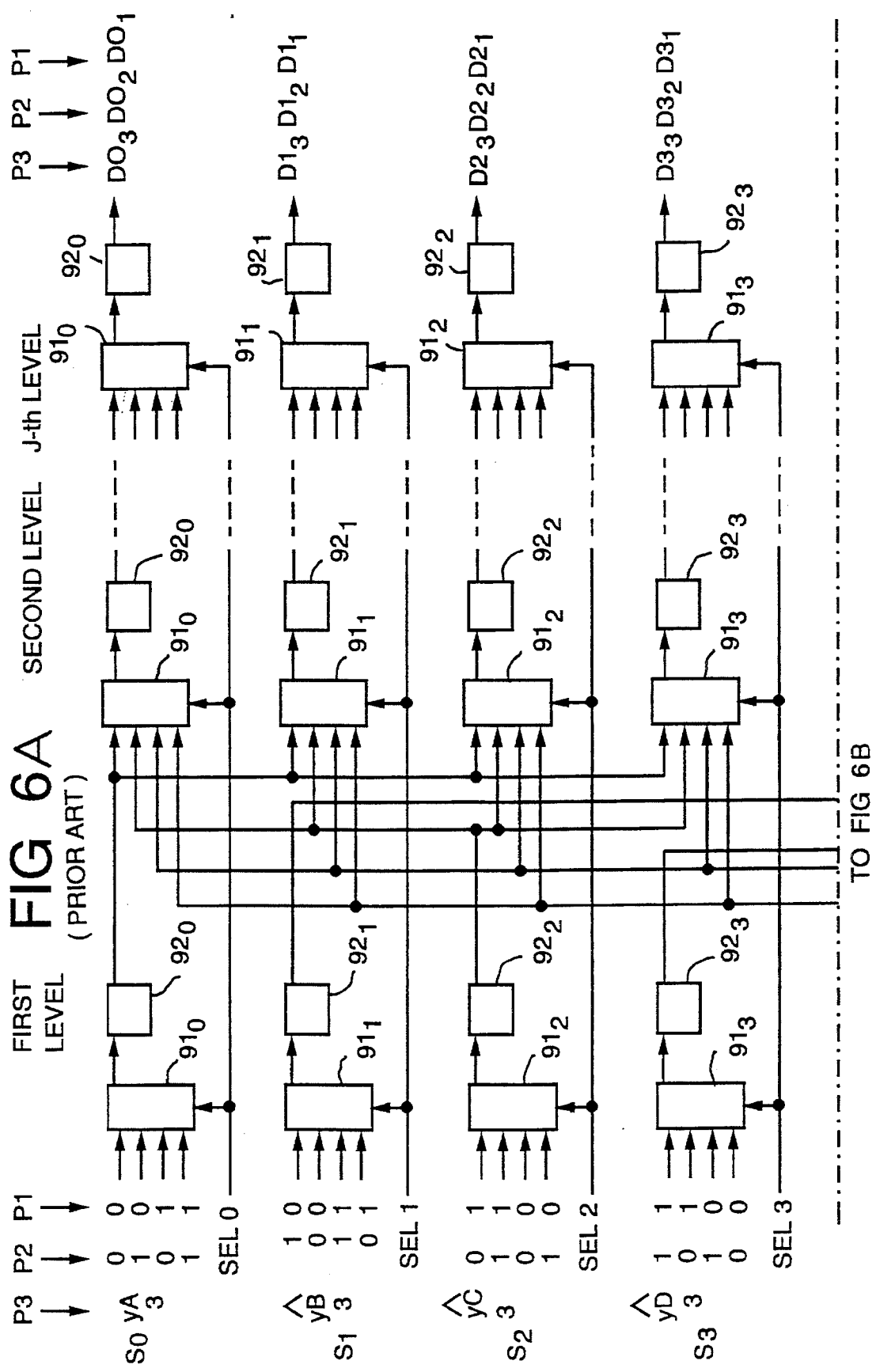
FIG. 6 is a block diagram showing the construction of first to third memories constituting the path-memory circuit shown in FIG. 3.
Figure 6B:
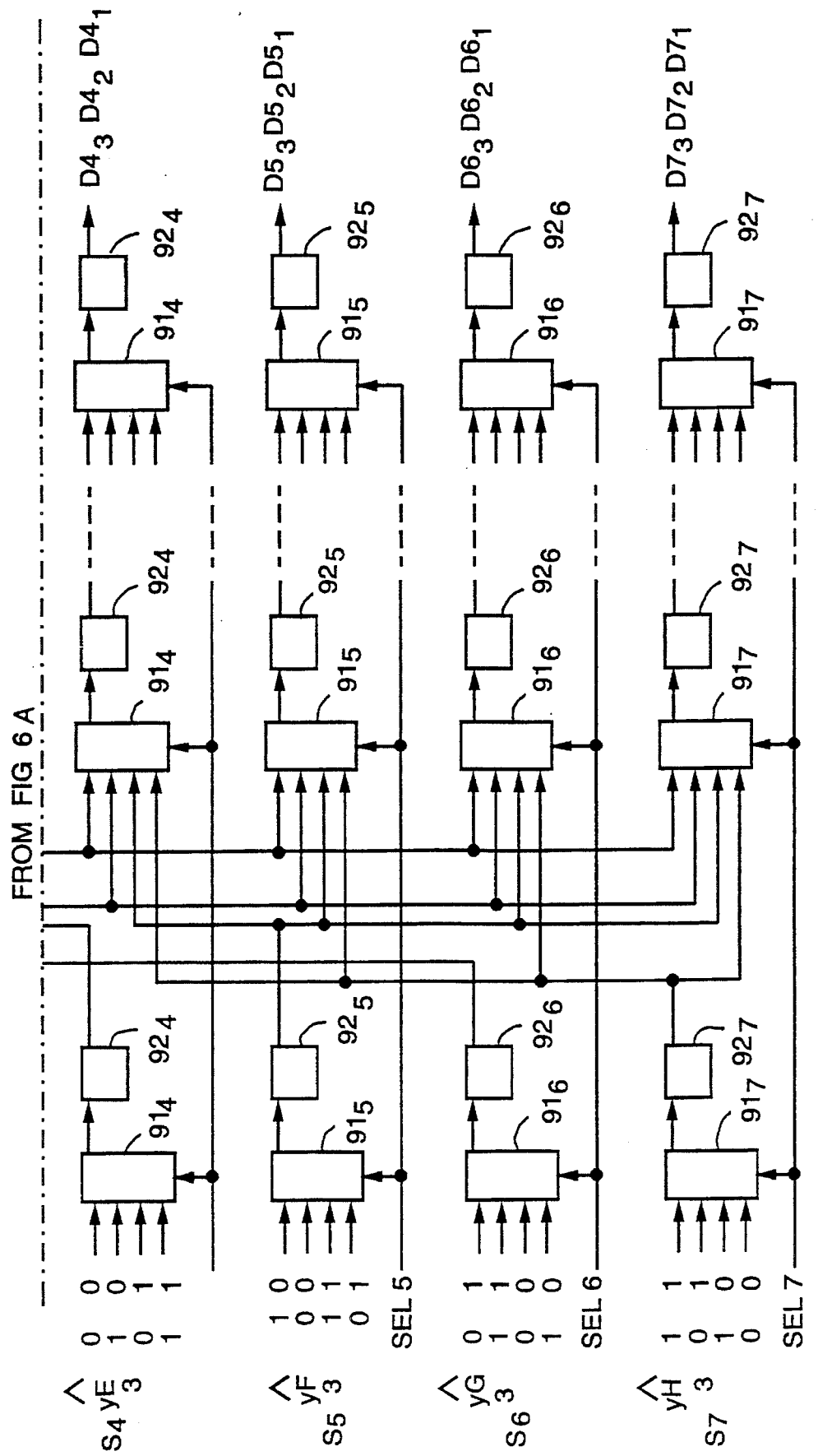

(2) The initial values applied to the memory P0 are different from the initial values applied to the third memory P3 shown in FIG. 6.

(3) None of the output signals of the noncoding bit detector 129 are inputted to the path-memory circuit 126.

Figure 8B:
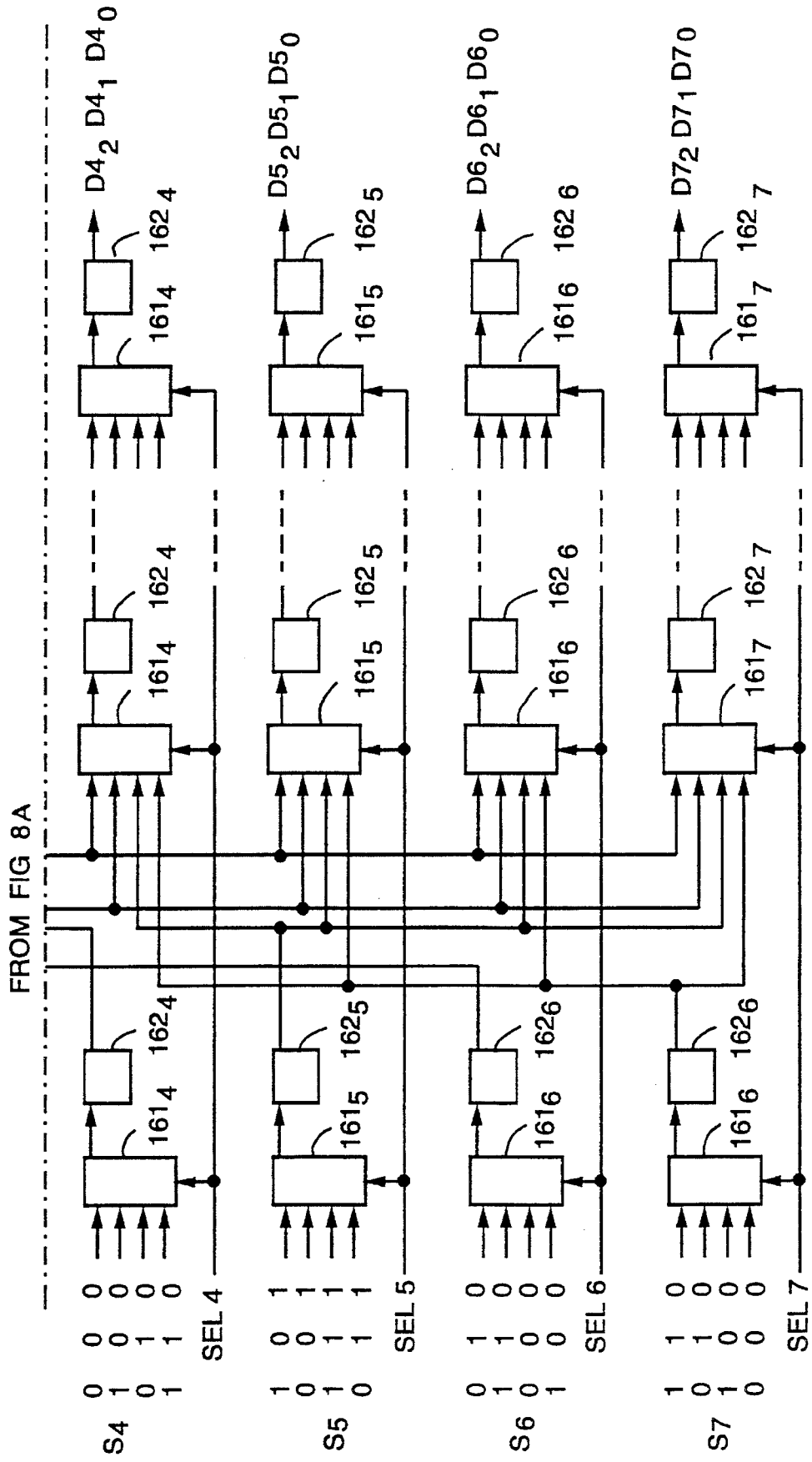
FIG. 8 is a block diagram showing the construction of first to third memories constituting the path-memory circuit shown in FIG. 7.

In other words, as shown in FIG. 8, the path-memory circuit 126 has j-level construction. Here, each of the levels is made up of eight selectors $161_0$–$161_7$ that select one of the four input signals in accordance with selector signals $SEL_0$–$SEL_7$ sent thereto from the ACS circuit 125 and eight registers $162_0$–$162_7$ that store the output signals of the selectors $161_0$–$161_7$. As shown in FIG. 8, the input signals of each selector $161_0$–$161_7$ on the first level are, in the memory P0, initial value (0000) for selector $161_0$ of state $S_0$, selector $161_2$ of state $S_2$, selector $161_4$ of state $S_4$, selector $161_6$ of state $S_6$, and selector $161_7$ of state $S_7$ and initial value (1111) for selector $161_1$ of state $S_1$, selector $161_3$ of state $S_3$, and selector $161_5$ of state $S_5$. In the first memory P1, the input signals are initial value (0011) for selector $161_0$ of state $S_0$, selector $161_1$ of state $S_1$, selector $161_4$ of state $S_4$, and selector $161_5$ of state $S_5$ and initial value (1100) for the remaining selectors $161_2$, $161_3$, $161_6$, and $161_7$. In the second memory P2, the input signals are initial value (0101) for selector $161_0$ of state $S_0$, selector $161_4$ of state $S_4$, and selector $161_6$ of state $S_6$ and initial value (1010) for the remaining selectors $161_1$, $161_2$, $161_3$, $161_5$, and $161_7$. The input signals for each selector $161_0$–$161_7$ on the second and succeeding levels are, for selectors $161_0$–$161_3$, the output signals of registers $162_0$, $162_2$, $162_4$, and $162_6$, respectively, on the previous level, and for selectors $161_4$–$161_7$, the output signals of registers $162_1$, $162_3$, $162_5$, and $162_7$, respectively, on the previous level. The output signals of registers $162_0$–$162_7$ on the j-th level are the respective states $D0_0$–$D7_0$ in memory P0, the respective states $D0_1$–$D7_1$ in memory P1, and the respective states $D0_2$–$D7_2$ in memory P3. The operation of each selector $161_0$–$161_7$ and each register $162_0$–$162_7$ on each level is carried out in parallel and synchronously within the symbol time.

In the first selector 128, based on the output signal of the most likely path setter 127, one combination is selected from states $D0_0$–$D7_0$, $D0_1$–$D7_1$, and $D0_2$–$D7_2$ (hereinafter referred to as D0–D7) of each memory P0–P2 sent thereto from the path-memory circuit 126. In a case where the output signal of the most likely path setter 127 indicates path metric accumulated value PM0 of state $S_0$, state $D0_0$ of memory P0 state $D0_1$ of first memory P1, and state $D0_2$ of second memory P2 are selected, respectively. Here, the value of each state selected in the first selector 128 is the 3-bit data indicating the value stored in each register $162_j$, respectively, on the j-th level of state i which has the most likely path selected in the first selector 128. This 3-bit data is the estimated values $(y_2 y_1 y_0)$ of three lower-order bits $y_2$, $y_1$, $y_0$ of 4-bit error-correcting encoded information symbol string $(y_3 y_2 y_1 y_0)$. The two higher-order bits $y_2$, $y_1$ of estimated values $(y_2 y_1 y_0)$ are the two lower-order bits $x_1$, $x_2$ of desired decoded data $(x_3 x_2 x_1)$. The 3-bit data selected at the first selector 128 is outputted from the first selector 128 to the second selector 131 and used in the second selector 131 as selection information.

Figure 1:
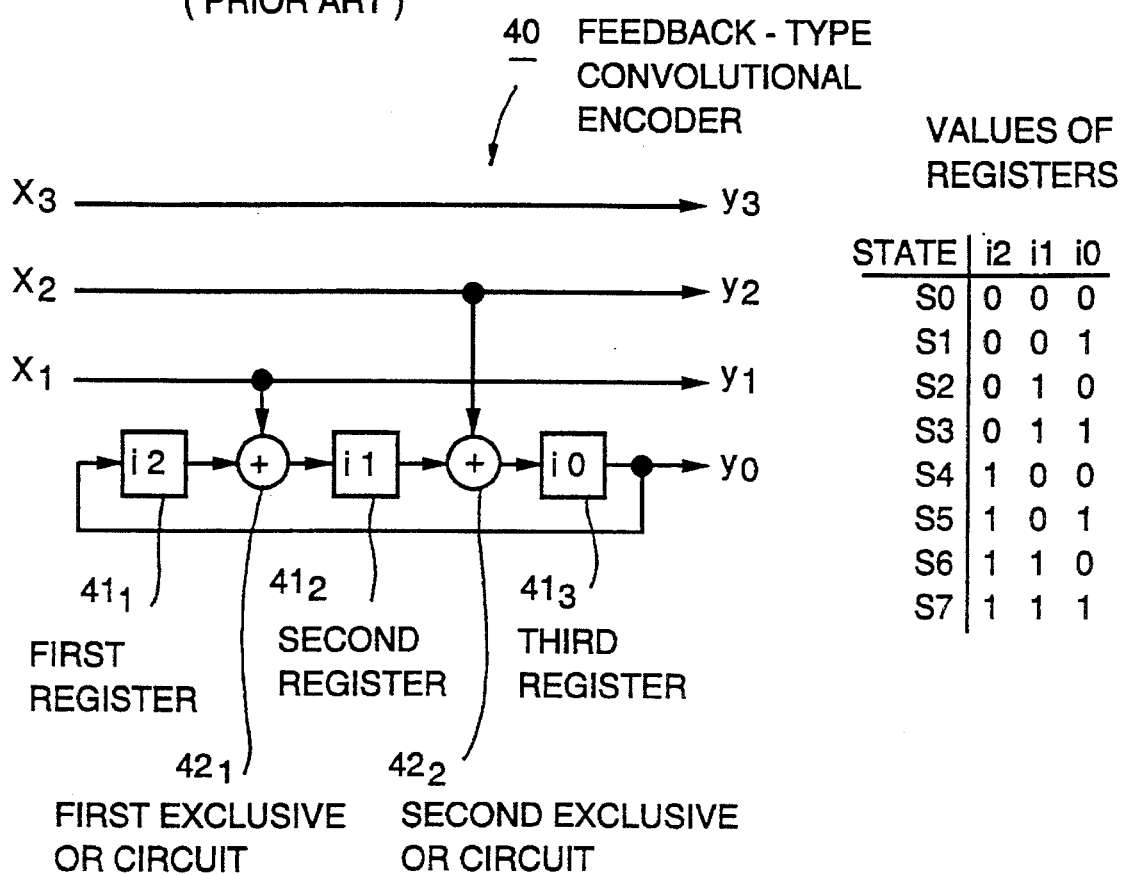
FIG. 1 shows one example of the construction of a feedback-type convolutional encoder.
Figure 2:
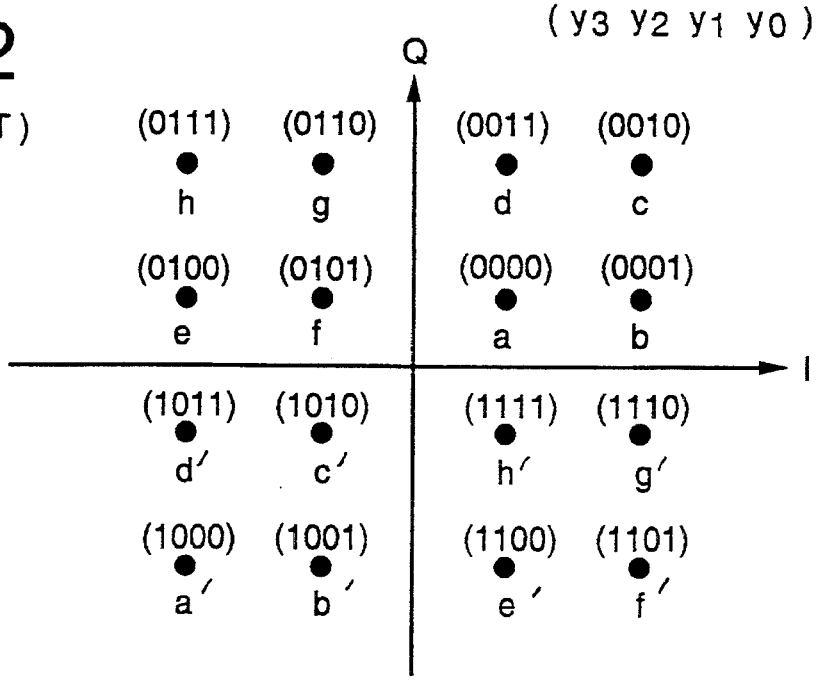
FIG. 2 illustrates the 16 transmission symbol points two-dimensionally distributed on a plane based on an I-axis and a Q-axis of quadrature amplitude modulation.

In the second selector 131, based on the $_3$-bit data (estimated values $(\hat{y}_2 \hat{y}_1 \hat{y}_0)$) selected in the first selector 128, only one output signal is selected that corresponds to the estimated value $(\hat{y}_2 \hat{y}_1 \hat{y}_0)$ from the output signals of the last level of each j-level shift register $130_0$–$130_7$. In other words, when estimated value $(\hat{y}_2 \hat{y}_1 \hat{y}_0)$ is determined, only one unique output signal exists that corresponds to this estimated value $(\hat{y}_2 \hat{y}_1 \hat{y}_0)$ among the output signals of the last level of each j-level shift register $130_0$–$130_7$, because, as can also be understood from FIG. 2, the two transmission symbol points that make up each subset A–H differ in the value of highest-order bit $y_3$, and one transmission symbol point is selected for every subset A–H in the subset maximum likelihood estimator 124. The value selected in the second selector 131 is the estimated value $(\hat{y}_3)$ of the highest-order bit $y_3$ of 4-bit error-correcting encoded information symbol string $(y_3 y_2 y_1 y_0)$ and is the highest-order bit $x_3$ of desired decoded data $(\hat{x}_3 \hat{x}_2 \hat{x}_1)$.

The above operation is repeated every time I-channel data Ich and Q-channel data Qch are inputted to the input terminals 121, 122 respectively, and decoded data $(\hat{x}_3 \hat{x}_2 \hat{x}_1)$ is obtained j symbol times after I-channel data Ich and Q-channel data Qch are inputted to the input terminals 121, 122, respectively.

Figure 9:
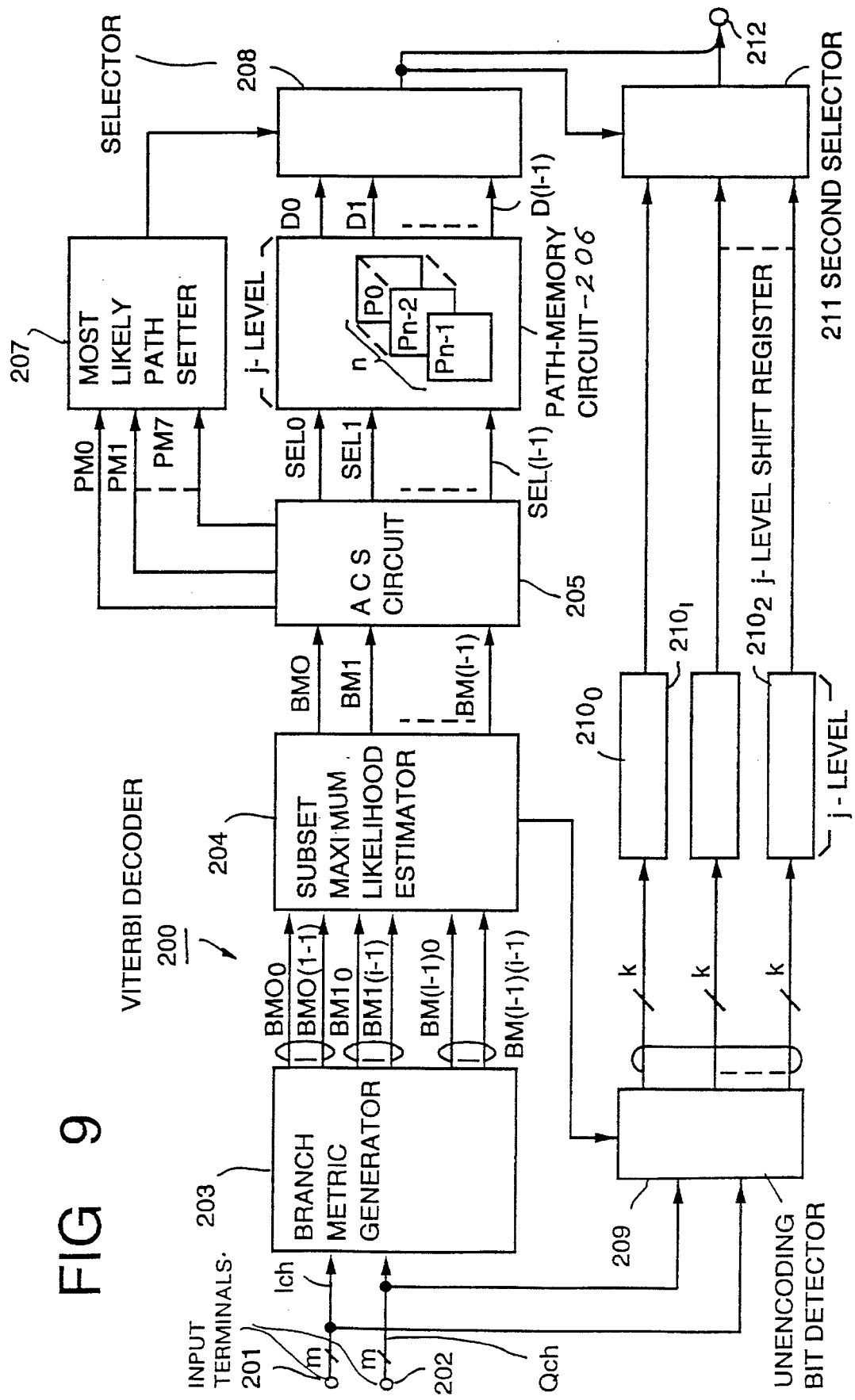
FIG. 9 is a block diagram showing the typical construction of a Viterbi decoder according to the present invention.

The Viterbi decoder 120 according to the first embodiment of the present invention shown in FIG. 7 is provided for decoding a 4-bit error-correcting encoded information symbol string $(y_3 y_2 y_1 y_0)$. The typical construction of a Viterbi decoder according to the present invention is shown in FIG. 9. The Viterbi decoder 200 is for decoding an (n+1)-bit error-correcting encoded information symbol string $(y_n y_{n-1} \ldots y_1 y_0)$. In FIG. 9, code "k" indicates the bit number of the noncoding bits within (n+1)-bit error-correcting encoded information symbol string $(y_n y_{n-1} \ldots y_1 y_0)$ and code "l" indicates the number of states. If "r" is the number of registers of the feedback-type convolutional encoder, then l=2r.

While the present invention has been described in conjunction with preferred embodiments thereof, it will now be possible for one skilled in the art to easily put the present invention into practice in various other manners.

What is claimed is:

1. A Viterbi decoder for decoding an error-correcting encoded information symbol string by estimating encoding bits, redundant bits and noncoding bits included in the error-correcting encoded information symbol string from two demodulated signals obtained by orthogonal detection of a modulated signal which is generated by quadrature amplitude modulation of the error-correcting encoded information symbol string by mapping the error-correcting encoded information symbol string to one of transmission symbol points in accordance with a value thereof, the error-correcting encoded information symbol string being generated by error-correcting encoding an information symbol string by means of a feedback-type convolutional encoding algorithm, comprising:

branch metric generating means for finding branch metrics indicating distances from each of the transmission symbol points to a reception symbol point indicated by the two demodulated signals;

subset maximum likelihood estimating means for dividing each of the transmission symbol points by every subset and for finding every subset branch metric representative value for the branch metrics found by the branch metric generating means, and for producing information indicating the transmission symbol points corresponding to the found branch metric representative values;

accumulator switch means for selecting the greatest addition value as a new path metric accumulated value for one state by adding each path metric accumulated value to one predetermined branch metric representative value found by the subset maximum likelihood estimating means, the path metric accumulated values being held by several states combined in transition with said one state among the states determined in the feedback-type convolutional encoding algorithm;

path-memory means for carrying out path selection in path-memories provided for estimating the encoding bits, the noncoding bits, and the redundant bits of the error-correcting encoded information symbol string in accordance with the path metric accumulated values for the states selected by the accumulator switch means;

most likely path setting means for finding the present most likely path information from the path metric accumulated values held by the accumulator switch means;

first selection means for selecting the least recent value of the path selected by the path-memory means in accordance with the most likely path information found by the most likely path setting means;

noncoding bit detecting means for extracting noncoding bits of the transmission points relating to the branch metric representative values found by the subset maximum likelihood estimating means based on the information indicating the transmission symbol points produced by the subset maximum likelihood estimating means;

noncoding bit holding means for holding each noncoding bit extracted by the noncoding bit detecting means for a prescribed period of time; and second selection means for selecting one noncoding bit from the noncoding bits held in the noncoding bit holding means in accordance with the value of the path selected by the first selection means.

2. The Viterbi decoder of claim 1 wherein the noncoding bit holding means includes a number of shift registers on a plurality of levels, the number being equal to one half the number of transmission symbol points.

3. A digital communication system having as an input, an information symbol string error-correcting encoded by a feedback-tupe convoltional encoding algorithm, the encoded information symbol string having encoding bits, noncoding bits and redundant bits, the system comprising:

a Viterbi decoder for decoding the error correcting encoded information symbol string by estimating said encoding bits, redundant bits and noncoding bits including in the error correcting encoded information symbol string from two demodulated signals obtained by orthogonal detection of a modulated signal which is generated by quadrature amplitude modulation of the error-correcting encoded information symbol string by mapping the error-correcting encoded information symbol string to one of transmission symbol points in accordance with a value thereof, and further comprising:

branch metric generation means for finding branch metrics indicating distances from each of the transmission symbol points to a reception symbol point indicated by the two demodulated signals:

subset maximum likelihood estimating means for dividing each of the tramsmission symbol points by every subset and for finding every subset branch metric representative value for the branch metrics found by the branch metric generating means, and for producing information indicating the transmission symbol points corresponding to the found branch metric representative values;

accumulator switch means for selecting the greatest addition value as a new path metric accumulated value for one state by adding each metric accumulated value to one predetermined branch metric representative value found by the subset maximum likelihood estimating means, the path metric accumulated values being held by several states combined in transition with said one state among the states determined in the feedback-type convolutional encoding algorithm;

path-memory means for carrying out path selection in path-memories provided for estimating the encoding bits, the noncoding bits, and the redundant bits of the error-correcting encoded information symbol string in accordance with the path metric accumulated values for the states selected by the accumulator switch means;

most likely path setting means for finding the present most likely path information from the path metric accumulated values held by the accumulator switch means;

first selection means for selecting the least recent value of the path selected by the path-memory means in accordance with the most likely path information found by the most likely path setting means;

noncoding detecting means for extracting noncoding bits of the transmission points relating to the branch metric representative values found by the subset maximum likelihood estimated means based on the information indicating the transmission symbol points produced by the subset maximum likelihood estimating means;

noncoding bit holding means for holding each noncoding bit extracted by the noncoding bit detecting means for a prescribed period of time; and second selection means for selecting one noncoding bit form the noncoding bits held in the noncoding bit holding means in accordance with the value of the path selected by the first selection means.

4. The digital communication system of claim 3 wherein the noncoding bit holding means includes a number of shift registers on a plurality of levels, the number being equal to one-half the number of transmission symbol points.

* * * * *